United States Patent [19]
Shebanow et al.

[11] Patent Number: 5,367,494
[45] Date of Patent: Nov. 22, 1994

[54] RANDOMLY ACCESSIBLE MEMORY HAVING TIME OVERLAPPING MEMORY ACCESSES

[75] Inventors: Michael C. Shebanow, Austin; Mitchell K. Alsup, Dripping Springs; Hunter L. Scales; George P. Hoekstra, both of Austin, all of Tex.

[73] Assignee: Motorola, Inc., Schaumburg, Ill.

[21] Appl. No.: 113,632

[22] Filed: Aug. 31, 1993

Related U.S. Application Data

[63] Continuation of Ser. No. 702,880, May 20, 1991, abandoned.

[51] Int. Cl.⁵ .......................... G11C 8/00; G11C 7/00
[52] U.S. Cl. .......................... 365/230.03; 365/230.05; 365/230.06; 365/230.08; 365/189.04; 365/189.05; 365/193
[58] Field of Search .............. 365/230.03, 230.05, 365/230.06, 230.08, 189.04, 189.05, 193

[56] References Cited

U.S. PATENT DOCUMENTS

| | | | |
|---|---|---|---|
| 5,012,408 | 4/1991 | Conroy | 365/230.03 |
| 5,036,493 | 7/1991 | Nielsen | 365/230.03 |
| 5,060,145 | 10/1991 | Scheuneman et al. | 365/230.03 |
| 5,150,330 | 9/1992 | Hag | 365/230.03 |

*Primary Examiner*—Timothy P. Callahan
*Assistant Examiner*—Trong Phan
*Attorney, Agent, or Firm*—Elizabeth A. Apperley

[57] ABSTRACT

A memory device (28) executes memory access operations of two or more storage locations concurrently. The memory device (28) is comprised of a plurality of memory bank decode logic circuits (30, 32, 56) and a plurality of memory banks (34, 52). Each of the decode logic circuits decodes a first information and control signal set to enable a first memory bank to begin and complete a memory access operation. Each memory bank is comprised of a plurality of latch circuits (39, 40, 42, 50) to store a predetermined information and control signal set necessary to perform the memory access operation. A second control signal and information set may, therefore, enable a second memory bank within the memory device (28) to perform a second memory access operation concurrently in time with the first memory access operation.

11 Claims, 4 Drawing Sheets

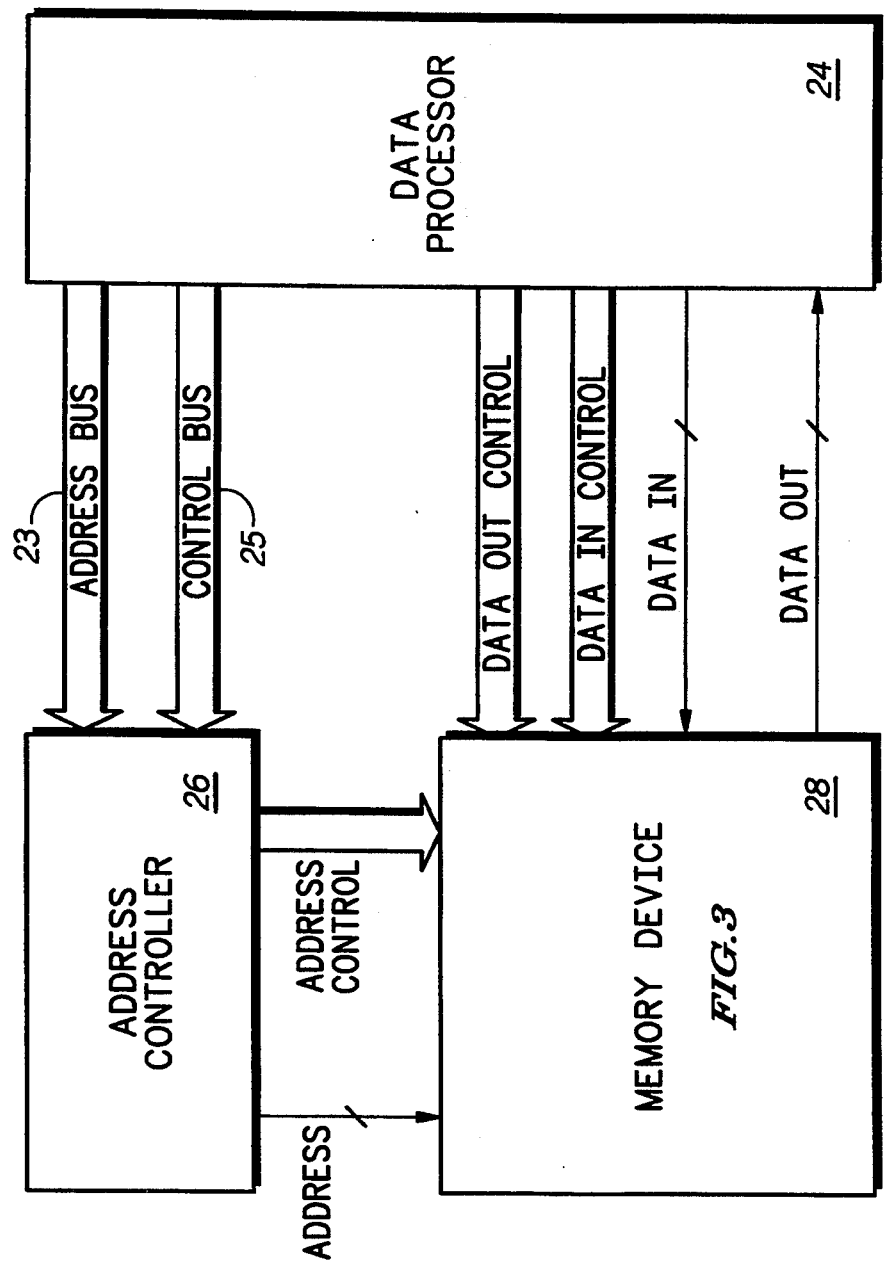

RANDOMLY ACCESSIBLE MEMORY HAVING TIME OVERLAPPING MEMORY ACCESSES

This application is a continuation of prior application Ser. No. 07/702,880, filed May 20, 1991, now abandoned.

FIELD OF THE INVENTION

This invention relates generally to memories and more particularly, to a randomly accessible memory.

BACKGROUND OF THE INVENTION

As data processing systems operate at faster speeds, associated peripheral memory devices must be able to function at compatible frequencies. However, as semiconductor technologies improve performance, the frequency at which a data processing system operates has increased to equal or even surpass the operating frequency of peripheral memory devices. In the latter case, the data processing system must often wait several clock cycles for information to be received from peripheral memory devices. Consequently, several techniques have been introduced to alleviate or shorten the latency between the performance of peripheral memory devices and the performance of the data processing system.

In one technique, a fast memory device called a "cache" is placed between the data processing system and a peripheral memory device. In this example, a peripheral memory device typically stores the bulk of information needed or provided by the data processing system. However, the peripheral memory device is not able to provide information in a single clock cycle and the data processing system must wait for several clock cycles before beginning to process another instruction. In comparison, the fast memory device provides information very quickly. Therefore, if the fast memory device is used to store the information values which are most often accessed by the data processing system, the period of time which the data processing system waits to receive information is generally shortened. By using this technique, the bulk of the information is still stored in the peripheral devices, but the information most frequently used is stored in the fast memory device.

The fast memory device may be integrated within the structure of the data processing system or implemented externally between the data processing system and the peripheral memory device. In either case, the fast memory device is an expensive solution. If the fast memory device is integrated within the structure of the data processing system as a portion of the semiconductor device, the fast memory device consumes a substantial amount of circuit area. Rather than providing other circuitry to further enhance the functionality of the data processing system, a fast memory device must be integrated in the data processing system to maintain the highest operating frequency. If one or more fast memory devices are implemented externally to the data processing system, the additional external fast memory devices result in a higher system overhead cost.

In a second technique, a memory subsystem compensates for the difference in the operation frequencies of the memory subsystem and the data processing system by allowing multiple concurrent accesses of different addresses. The multiple concurrent accesses are accomplished by providing a plurality of memory banks wherein each of the memory banks is independently and distinctly addressed and controlled. When the addresses of the memory banks are arranged such that the consecutive addresses are provided by n different memory banks, where n is an integer, the memory subsystem is n-way interleaved.

When the data processing system accesses the peripheral memory devices in an interleaved manner, a first address of a first memory bank is accessed and then a first address of a second memory bank is concurrently accessed. Similarly, a plurality of other memory banks may be accessed while the first and the second memory banks continue to process a respective memory access. During an interleaved memory access, the data processing system may access any predetermined number of addresses concurrently.

When the data processing system provides an address to access one of a plurality of contiguous information values, the address is decoded and indicates which one of the plurality of memory banks contains the information value. To access the memory banks in an interleaved manner, addresses must be decoded such that the plurality of contiguous information values are contained in different memory banks and, therefore, may be accessed concurrently.

In a standard memory device, an access time is defined as the time from the start of execution of an operation to the end of operation execution. For example, in a read operation in the standard memory device, the access time is defined as the time from the start of execution of the read operation until the data read during the read operation is ready for use in a subsequent operation. The time from the start of execution of an operation until the device may execute another operation is referred to as the "cycle time."

In an interleaved memory access, the cycle time necessary to execute a first access of the first memory device is dependent on the cycle time of the first memory device. However, the time necessary to begin execution of subsequent operations is shortened, since the subsequent operations are executed concurrently with the first memory access. Although the cycle time of each of the peripheral memory devices remains the same, the data processing system is able to overlap the accesses of each of the peripheral memory devices and, therefore, increases the number of operations executed in a given amount of time.

Although interleaved addressing allows the data processing system to concurrently access peripheral memory devices, the overhead cost is expensive. For example, a predetermined number of external peripheral memory devices is necessary to implement interleaved addressing and, therefore, results in higher system overhead costs.

Both the fast memory device implementation and the interleaved addressing method result in an increased system overhead cost. Additionally, if the fast memory device is integrated within the structure of the data processing system, the designer of the data processing system must compromise between system functionality and system cost.

SUMMARY OF THE INVENTION

The previously mentioned needs are fulfilled with the present invention. Accordingly, there is provided, in one form, a randomly accessible memory having time overlapping memory accesses. The randomly accessible memory is comprised of a plurality of storage banks. Each storage bank is independently addressable and comprises an address port for receiving an input address, a data port for communicating data, an array of memory storage elements, and a storage means coupled to the array of memory storage elements for storing address information, and either input data or output data in response to the input address. The storage banks are implemented in a single integrated circuit and a plurality of the storage banks are accessed during a plurality of multiple overlapping time periods.

These and other features, and advantages, will be more clearly understood from the following detailed description taken in conjunction with the accompanying drawings.

BRIEF DESCRIPTION OF THE DRAWINGS

FIG. 2 illustrates in block diagram form a data processing system having a randomly accessible memory in accordance with the present invention;

DETAILED DESCRIPTION OF A PREFERRED EMBODIMENT

Figure 1A:
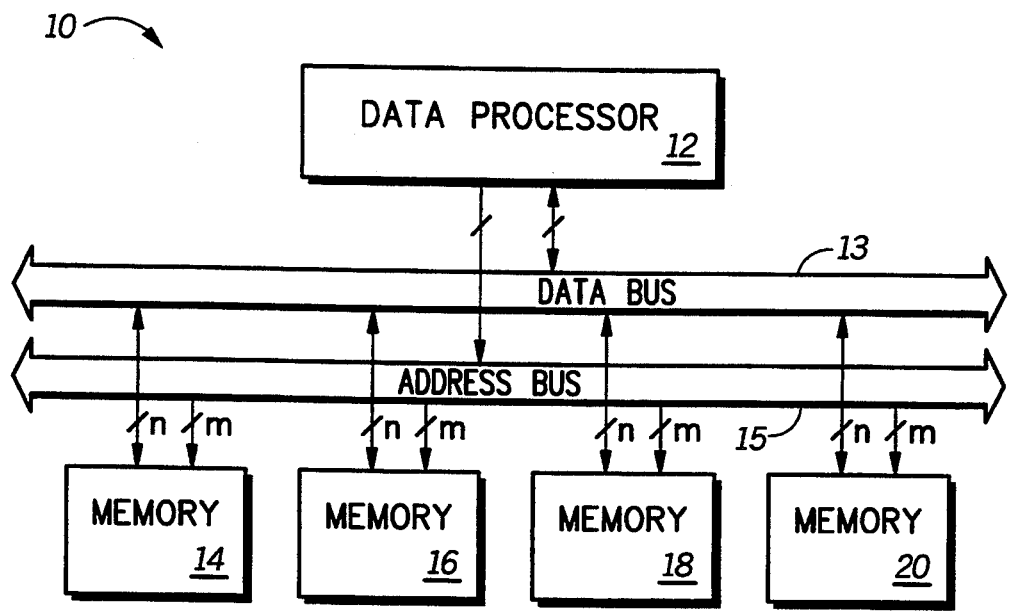
FIG. 1(A) illustrates in block diagram form a known data processing system having a plurality of randomly accessed memory portions.

Illustrated in FIG. 1(A) is a known data processing system 10 having a plurality of randomly accessed memory portions. Memory portions which are randomly accessed allow a user of the system to access information based solely on address or data values, and not on sequential ordering. Any address or data value may be accessed regardless of the address or data values previously accessed.

The data processing system 10 is generally comprised of a Data Processor 12 and a plurality of randomly accessed memory portions, Memory 14, Memory 16, Memory 18, and Memory 20.

The Data Processor 12 provides information to and receives information from the plurality of randomly accessed memory portions via an Address Bus 15 and a Data Bus 13, respectively. The Address Bus 15 is m bits wide and the Data Bus 13 is n bits wide, where both m and n are integers. If the Data Processor 12 requests a predetermined information value to be retrieved from the memories 14, 16, 18, and 20, an address signal corresponding to an associated storage location of the information value is transferred to the appropriate randomly accessed memory portion via Address Bus 15. Assume in this example that Memory 14 contains the predetermined information value. Memory 14 then decodes the address signal to enable the associated storage location to provide the predetermined information value to the Data Processor 12 via the Data Bus 13.

In general, a memory cycle reflects the length of time necessary to accomplish a read or write access of a memory portion in a data processing system. The time necessary to perform a memory access is determined by a cycle time of the memories 14, 16, 18, and 20.

Figure 1B:
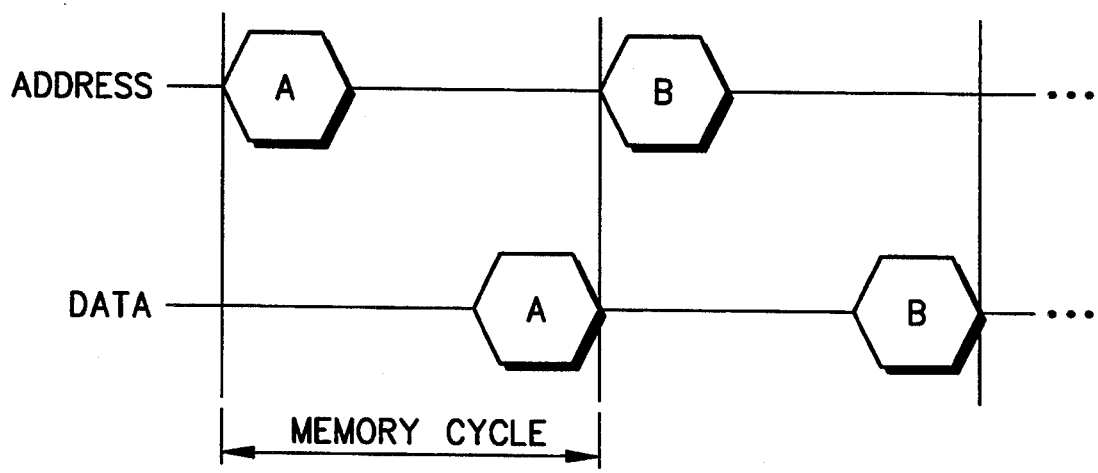
FIG. 1(B) illustrates in timing diagram form a common timing diagram of a memory access in one embodiment of the data processing system of FIG. 1(A)

A memory cycle of the data processing system 10 is illustrated in FIG. 1(B). In this example, a first information value is labelled "A" and a second information value is labelled "B." The information value A is accessed by transferring a first corresponding address value to a first predetermined one of the plurality of randomly accessed memories 14, 16, 18, and 20 via the Address Bus 15. The data processing system 10 must wait until the first predetermined memory portion decodes the corresponding address value to output the information value A via the Data Bus 13. After the information value A is output, the information value B is accessed by transferring a second corresponding address value to a second predetermined one of the plurality of randomly accessed memories 14, 16, 18, and 20 by the Address Bus 15. The data processing system 10 must again wait until the second predetermined memory decodes the second corresponding address value to provide the information value B via the Data Bus 13. When accessing both the information value A and the information value B, the memory cycle time is determined by the mount of time necessary to access and retrieve the information values from the corresponding memory portions.

If the cycle time of the plurality of the randomly accessed memories 14, 16, 18, and 20 is slower than the operation frequency of the Data Processor 12, the Data Processor 12 typically waits during a memory access. Generally, in a data processing system in which a data processor operates at a frequency which is substantially faster than the cycle time of an associated peripheral memory device, the productivity of the system is noticeably degraded. Assume that the Data Processor 12 operates at a frequency which is faster than the cycle time of the plurality of peripheral memory devices. During the period of time in which one of the plurality of peripheral memory device provides information, the Data Processor 12 typically waits without providing any other useful function. Therefore, even if the Data Processor 12 operates at a high frequency, the performance and efficiency of the entire data processing system is partially dependent on the cycle time of the peripheral memory devices. The performance and efficiency is also partially dependent on the number of peripheral memory devices which can concurrently perform memory access operations and the frequency with which information can be transferred between the peripheral memory devices and the data processing system.

The invention described herein provides a randomly accessible memory with time overlapping memory accesses which allows the data processing system to perform concurrent memory access operations in a fixed amount of time. The randomly accessible memory begins to process a new memory access operation at the start of each clock cycle. Therefore, more memory access operations are begun and subsequently completed in a shorter average amount of time. A plurality of other memory devices may be accessed while the first and the second devices process a respective first and a second memory access operation. During the memory access operations, the randomly accessible memory processes a plurality of memory access operations of one or all of the peripheral memory devices concurrently.

Illustrated in FIG. 2 is a data processing system 22 in accordance with the present invention which enhances and maximizes the efficiency with which memory access operations are performed. The data processing system 22 has a Data Processor 24, an Address Controller 26, and a Memory Device 28.

The Data Processor 24 provides a plurality of address control and information signals necessary to perform a memory access of the Memory Device 28. A multi-bit address information signal is transferred to an input of the Address Controller 26 via an Address Bus 23 and indicates the storage location of an information value in the Memory Device 28. The information value is stored in the Memory Device 28 in one of a plurality of memory banks.

The Data Processor 24 transfers the plurality of address control signals to a plurality of address control inputs of the Address Controller 26 via a Control Bus 25. The plurality of address control signals provides control information necessary to enable the Address Controller 26 to perform a memory access operation.

The Address Controller 26 is comprised of a conventional standard logic circuit (not shown) which provides address control and information signals to a plurality of address inputs of the Memory Device 28. The Address Controller 26 determines the address of a predetermined memory storage location and a corresponding one of a plurality of memory banks which is enabled during a read or write operation of the Memory Device 28. The Address Controller 26 provides a multi-bit signal labelled "Address" to indicate the address of the memory storage location of the predetermined information value requested by the Data Processor 24. The Address Controller 26 also provides a plurality of address control signals to enable one of a plurality of memory banks (not shown) via a bus labelled "Address Control". In the preferred embodiment, the Address Control bus is comprised of three signals respectively labelled "Address Strobe," "R/$\overline{W}$," and "Address Bank."

The Address Strobe signal enables the Memory Device 28 to provide a memory storage location for an information value. The R/$\overline{W}$ (Read/Write) signal provides control information to enable the Memory Device 28 to either read an information value from or write an information value to a predetermined memory storage location. The multi-bit Address Bank signal enables a predetermined one of the plurality of memory banks to participate in a memory access operation.

The Data Processor 24 also provides a plurality of data control and information signals necessary to either read an information value from or write an information value to a predetermined memory storage location. To obtain the information value read from the predetermined memory storage location, a first data control signal is transferred to a first data control input of the Memory Device 28 illustrated in further detail in FIG. 3. The first data control signal is labelled "Data Out Strobe" and is transferred via a bus labelled "Data Out Control" which is illustrated in FIG. 2. When the Data Out Strobe signal is a logic high value, the Memory Device 28 is enabled to output an information value to a multi-bit bus labelled "Data Out." A second data control input is labelled "Data Out Bank Address" and is also transferred by the Data Out Control bus. The Data Out Bank Address signal also enables a predetermined one of the memory banks to provide an information value to the Data Out bus.

To write (i.e. store) the information value to a predetermined memory storage location, a third data control signal is transferred from the Data Processor 24 to a third data control input of the Memory Device 28. The third data control signal is labelled "Data In Strobe" and is transferred via a bus labelled "Data In Control." The Data In Strobe signal enables the Memory Device 28 to latch an information value to be written to a predetermined memory storage location. A fourth data control signal is transferred from the Data Processor 24 to a fourth control input of the Memory Device 28. The fourth data control signal is labelled "Data In Bank Address" and is also transferred via the Data In Control bus. The Data In Bank Address signal enables a predetermined one of the plurality of memory banks to write an information value to a predetermined memory storage location. The information value to be stored in the Memory Device 28 is transferred from the Data Processor 24 to an input of Memory Device 28 via a multi-bit signal labelled "Data In."

Figure 3:
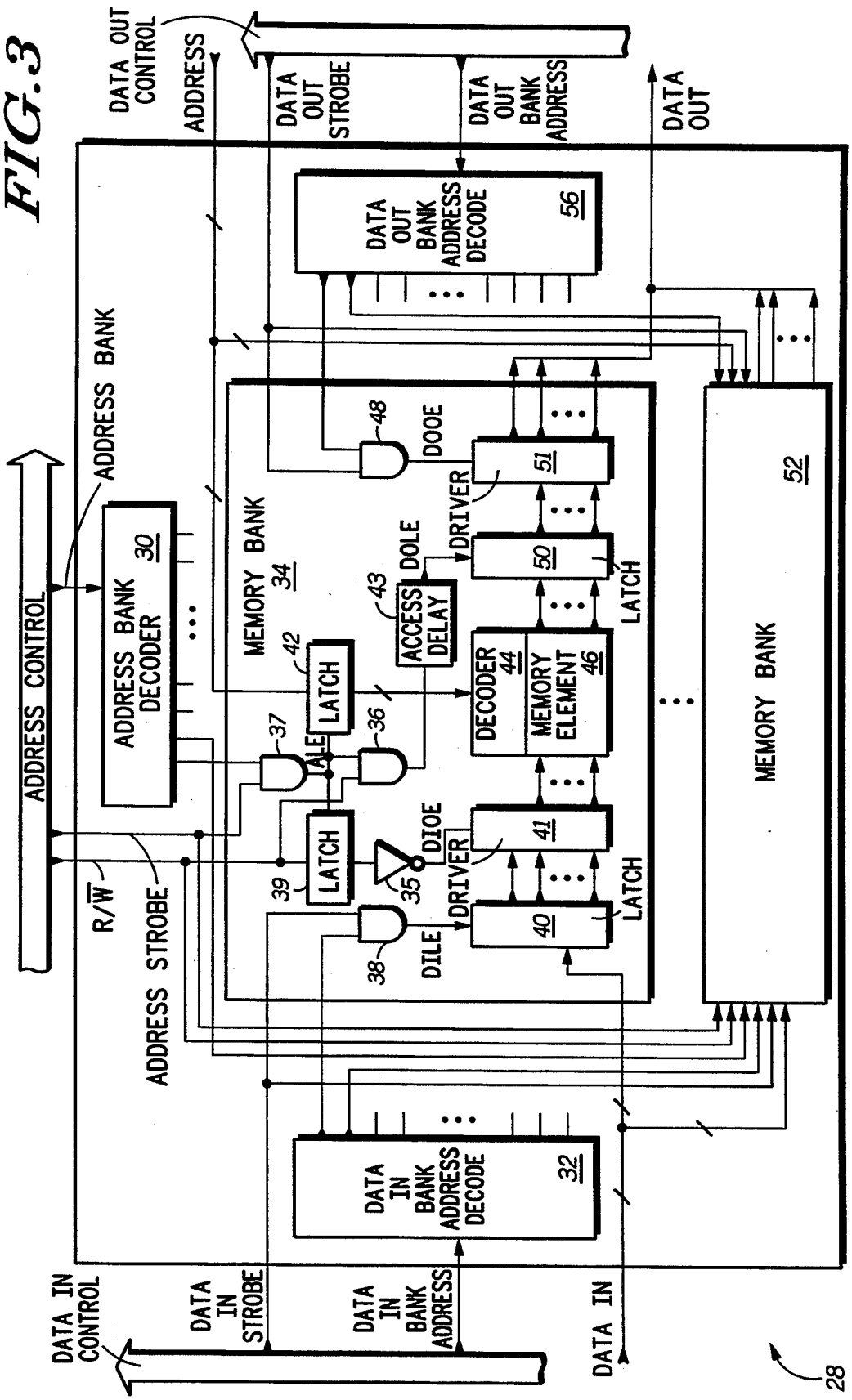
FIG. 3 illustrates in partial block diagram form a Memory Device as shown in FIG. 2.

Memory Device 28 maximizes the efficiency with which the data processing system 22 performs a memory access operation. As illustrated in FIG. 3, the Memory Device 28 is generally comprised of an Address Bank Decoder logic circuit 30, a Data In Bank Address Decode logic circuit 32, a Data Out Bank Address Decode logic circuit 56, and a plurality of K memory banks, such as memory bank 34 and memory bank 52, where K is an integer.

Each one of the plurality of memory banks is comprised of an inverter 35, an AND gate 36, an AND gate 37, an AND gate 38, a latch circuit 39, a latch circuit 40, a driver circuit 41, a latch circuit 42, an Access Delay circuit 43, a decoder 44, a memory element 46, an AND gate 48, a latch circuit 50, and a driver circuit 51. The memory element 46 is a sub-block of memory within the Memory Device 28.

An encoded Data In Bank Address signal provides a multi-bit input to the Data In Bank Address Decode logic circuit 32 to enable a predetermined one of the plurality of memory banks to store an information value.

If the first memory bank 34 is enabled, the Data In Bank Address Decoder logic circuit 32 provides a control signal to a first input of AND gate 38. The Data In Strobe signal provides a second input to the AND gate 38. The output of the second AND gate 38 is a signal labelled "DILE," where DILE is an abbreviation for Data In Latch Enable. The DILE signal provides a control input to latch circuit 40.

The Data Processor 24 provides the multi-bit Data In signal to an input of each one of the plurality of memory banks. In memory bank 34, the Data In signal is connected to latch circuit 40 and provides an information value which is subsequently stored in a predetermined memory storage location during a write operation. The output of latch circuit 40 is connected to the driver circuit 41. The driver circuit provides a plurality of input signals to the memory element 46. Information output from the memory element 46 is connected to latch circuit 50. The latch circuit 50 provides a plurality of information inputs to driver circuit 51. A plurality of output signals of driver circuit 51 is transferred to the Data Processor 24 via the Data Out signal.

The Address Controller 26 provides the multi-bit Address signal to an address input to of each one of the plurality of memory banks. In memory bank 34, the Address signal is connected a plurality of information inputs of latch circuit 42. The output signals of latch circuit 42 are connected to decoder 44. The decoder 44 decodes the address location to determine the appropriate memory storage location of a predetermined information value within the memory element 46.

The Address Controller 26 also provides the multi-bit Address Bank signal to a plurality of control inputs of the Address Bank Decode logic circuit 30. The Address Bank Decoder logic circuit 30 provides a signal to enable a predetermined one of the plurality of memory banks in response to the encoded Address Bank signal.

If the signal enables the memory bank 34, the decoded Address Bank signal provides a first input to AND gate 37. The Address Strobe signal provides a second input to AND gate 37 and an output of AND gate 37 is a signal labelled "ALE," where ALE is an abbreviation for Address Latch Enable. The ALE signal provides a control signal to both latch circuit 39 and latch circuit 42, and a first input to AND gate 36.

The $R/\overline{W}$ signal provides a second input to AND gate 36 and an input to latch circuit 39. The $R/\overline{W}$ signal indicates whether the data processing system 22 is executing an operation to read an information value from or write an information value to a predetermined memory storage location in the Memory Device 28. An output of latch circuit 39 provides an input to inverter 35.

An output of inverter 35 is a signal labelled "DIOE." DIOE is an abbreviation for Data In Output Enable. The DIOE signal provides a control input to driver circuit 41.

An output of AND gate 36 provides a delay control signal to enable the Access Delay circuit 43. The delay control signal enables the Access Delay circuit 43 to wait a predetermined amount of time before providing a control signal labelled "DOLE" to a control input of latch circuit 50. The DOLE signal controls a transfer of an information value from memory element 46 to latch circuit 50.

The Data Out Bank Address Decode logic circuit 56 decodes each one of the Data Out Bank Address signals to enable a predetermined one of the plurality of memory banks. If the Data Out Bank Address Decode logic circuit 56 decodes the Data Out Bank Address signal to provide an input to memory bank 34, the decoded Data Out Bank Address signal provides a first input to AND gate 48.

The Data Out Strobe signal provides a second input to the AND gate 48 and an output of AND gate 48 provides a signal to enable driver circuit 51. When driver circuit 51 is enabled, an information value stored therein is transferred to the Data Processor 24 via the Data Out signal.

MEMORY READ OPERATION

When an information value is read from the Memory Device 28, the Data Processor 24 provides the plurality of address control and information signals to the Address Controller 26 and the plurality of data control and information signals to the Memory Device 28.

During a memory read operation, the Address Bank signal provides an encoded input signal to the Address Bank Decode logic circuit 30. The Address Bank Decoder logic circuit 30 decodes the Address Bank signal to enable a predetermined one of the plurality of memory banks. Assume in this example that the encoded Address Bank signal signifies that the information value to be read is stored in memory bank 34. Therefore, the Address Decoder logic circuit 30 provides a decoded Address Array signal with a high logic value to the first input of AND gate 37.

The Address Strobe signal provides a second input to AND gate 37 and is a logic high value to indicate that the Data Processor 24 is addressing a portion of the Memory Device 28. The output of AND gate 37, the ALE signal, is a logic high value to indicate that a memory access of memory bank 34 is implemented. The ALE signal is connected to the first input of AND gate 36 and a control input of both latch circuit 39 and latch circuit 42.

The Address Controller 26 provides an address of a predetermined memory storage location in the Memory Device 28 to the plurality of inputs of latch circuit 42 via the Address signal. The address of the predetermined memory storage location is temporarily stored in the latch circuit 42 when the ALE signal is asserted with a logic one value. The contents of latch circuit 42 subsequently provide inputs to decoder 44. Decoder 44 decodes the Address signal to enable a memory storage location in the memory element 46 which corresponds to the address location transferred via the Address signal.

The $R/\overline{W}$ signal provides an input to latch circuit 39. The $R/\overline{W}$ signal indicates whether the data processing system 22 is executing an operation to read an information value from or write an information value to a predetermined memory storage location in the Memory Device 28. During a read operation of a memory storage location, the $R/\overline{W}$ signal provides a logic high value to both latch circuit 39 and the second input of AND gate 36.

Because the ALE signal is a logic high value during a memory access operation, latch circuit 39 is enabled to store the value of the $R/\overline{W}$ signal. The latch circuit 39 subsequently provides the value of the $R/\overline{W}$ signal to the input of inverter 35.

Therefore, the output of inverter 35, the DIOE signal, is a logic low value. Consequently, driver circuit 41 is not enabled to transfer an information value to the memory element 46.

The $R/\overline{W}$ signal also provides a logic high value to the second input of AND gate 36. As previously described, the ALE signal provides a logic high value to the first input of AND gate 36. Subsequently, the AND gate 36 provides a logic high value as a control input to the Access Delay circuit 43. When the output of AND gate 36 has a logic high value, the Access Delay circuit 43 is enabled to wait for a predetermined amount of time and then to provide the DOLE signal to enable latch circuit 50 in the illustrated form. The predetermined amount of time corresponds to the amount of time necessary for the memory element 46 to output an information value.

Therefore, during a read operation, the output of AND gate 36 has a logic high value and subsequently enables the Access Delay circuit 43 to provide the DOLE signal. When the DOLE signal has a logic high value, the latch circuit 50 is enabled to temporarily store an information value from the predetermined memory storage location in the memory element 46. The contents of latch circuit 50 are subsequently transferred to a plurality of inputs of driver circuit 51.

Additionally, when the information value is transferred from the Memory Device 28, the Data Processor 24 provides the plurality of data control and information signals to the Memory Device 28 to control the transfer of the information value. The data control signals are comprised of the Data In Strobe, the Data In Bank Address, the Data Out Strobe and the Data Out Bank Address signals.

The Data In Strobe signal provides the first input to AND gate 38 and is a logic low value to indicate that the Data Processor 24 is reading, and not writing, a portion of the Memory Device 28. As well, when the information value is being read from, and not written to the Memory Device 28, the Data In Bank Address signal is not asserted. Therefore, the decoded Data In Bank Address signal provides a logic low value to the second input of AND gate 38.

Because both the Data In Strobe and the decoded Data In Array signals are a logic low value, the output of AND gate 38, the DILE signal, is also a logic low value. Thus, the DILE signal is not asserted and an information value is not transferred to the latch circuit 40.

The Data Out Strobe signal provides the first input to AND gate 48 and is a logic high value to indicate that the Data Processor 24 is performing a read operation of the Memory Device 28.

The Data Out Bank Address signal provides an input to the Data Out Bank Address Decode logic circuit 56. The Data Out Bank Address Decode logic circuit 56 decodes the Data Out Bank Address signal to identify a predetermined one of the plurality of memory banks which should be accessed. In this case, the encoded Data Out Bank Address signal signifies that the information value to be read is stored in memory bank 34. Therefore, the Data Out Bank Address Decode logic circuit 56 provides a decoded Data Out Bank Address signal with a logic high value to the second input of AND gate 48.

Because both the Data Out Strobe and the decoded Data Out Bank Address signals have a logic high value, the output of AND gate 48, the DOOE signal, is a logic high value. Driver circuit 51 is, therefore, enabled to provide the information value transferred therein by the latch circuit 50 to the Data Processor 28. The information value is transferred to the Data Processor 28 via the Data Out signal.

MEMORY WRITE OPERATION

Similarly, when an information value is transferred to and subsequently written to memory bank 34 of the Memory Device 28, the Data Processor 24 provides the plurality of address control and information signals to the Address Controller 26 and the plurality of data control and information signals to the Memory Device 28.

During the write operation to a predetermined memory storage location, the Address Bank signal provides an input signal to the Address Bank Decode logic circuit 30. The input signal subsequently provides a decoded Address Bank signal to identify one of the plurality of memory banks which should be accessed. Assume in this case, that the encoded Address Bank signal indicates the information value to be read is stored in memory bank 34. The Address Bank Decode logic circuit 30 then provides a decoded Address Bank signal with a logic high value to the first input of AND gate 37.

The Address Strobe provides a second input to AND gate 37 and is a logic high value to indicate that Data Processor 24 is accessing the Memory Device 28. Because both inputs to AND gate 37 have a logic high value, the output of AND gate 37, the ALE signal, also has a logic high value. The ALE signal provides the first input to AND gate 36 and a control input to both latch circuit 39 and latch circuit 42.

The Address signal transfers an address of a predetermined memory storage location to the latch circuit 42. Again, the address of the memory storage location is transferred to and temporarily stored in the latch circuit 42 when the ALE signal is a logic high value.

During an operation in which an information value is written to the memory element 46, the $R/\overline{W}$ signal has a logic low value. Because the ALE signal is a logic high value during a memory access operation, the latch circuit 39 is enabled to store the value of the $R/\overline{W}$ signal. The latch circuit 39 subsequently provides the value of the $R/\overline{W}$ signal to the input of inverter 35. The output of inverter 35, the DIOE signal, has a high logic value and provides a control input to driver circuit 41. Because the DIOE signal is a logic high value, the driver circuit 41 is enabled to transfer an information value stored therein to the memory element 46.

The $R/\overline{W}$ signal also provides a logic low value as the second input of AND gate 36. The AND gate 36 subsequently provides a logic zero value as a control input to the Access Delay circuit 43. Therefore, the Access Delay circuit 43 is not enabled to provide the DOLE signal to enable latch circuit 50 after a predetermined amount of time during a write operation.

The information value to be written to the memory element 46 is transferred to the latch circuit 40 via the Data In signal. Data control signals which are comprised of the Data Out Strobe, the Data Out Bank Address, the Data In Strobe and the Data In Bank Address signals enable the memory bank 34 to write the information value to the memory element 46.

The Data Out Strobe provides the first input to the AND gate 48 and is a logic low value to indicate that the Data Processor 24 is writing an information value to the Memory Device 28. Since the information value is written to the Memory Device 28, the Data Out Bank Address signal is not asserted. Therefore, the decoded Data Out Bank Address signal is not asserted and a logic low value is provided as the second input to AND gate 48. The output of AND gate 48, the DOOE signal, is then a logic low value and driver circuit 51 is not enabled to provide an output signal to Data Processor 24.

The Data In Strobe signal provides the first input to AND gate 38 and is a logic high value to indicate that the Data Processor 24 is writing a portion of Memory Device 28.

The Data In Bank Address signal provides an input to the Data In Bank Address Decode logic circuit 32. The Data In Bank Address Decode logic circuit 32 subsequently provides a decoded Data In Array signal to identify a predetermined one of the plurality of memory banks which should be accessed. In this case the encoded Data In Bank Address signal signifies that the information value to be written is stored in memory bank 34. Therefore, the Data In Bank Address Decode logic circuit 32 provides a decoded Data In Bank Address signal with a high logic value to the second input of AND gate 38.

Consequently, the output of AND gate 38, the DILE signal, has a high logic value and latch circuit 40 is enabled to store an information value to be written to the memory element 46. Likewise, because the output of AND gate 36 is a logic high value, the driver circuit 41 is enabled to write the information value stored in latch circuit 40 to the Memory element 46.

Latch circuit 40 stores and driver circuit 41 subsequently transfers the information value to the corresponding storage location in memory element 46 when the DILE and the DIOE signals are respectively a logic high value. The information value stored in latch circuit 40 is then written by the driver circuit 41 to the address location in memory element 46 determined by the data processing system 22.

TIMING EXAMPLE

Figure 4:
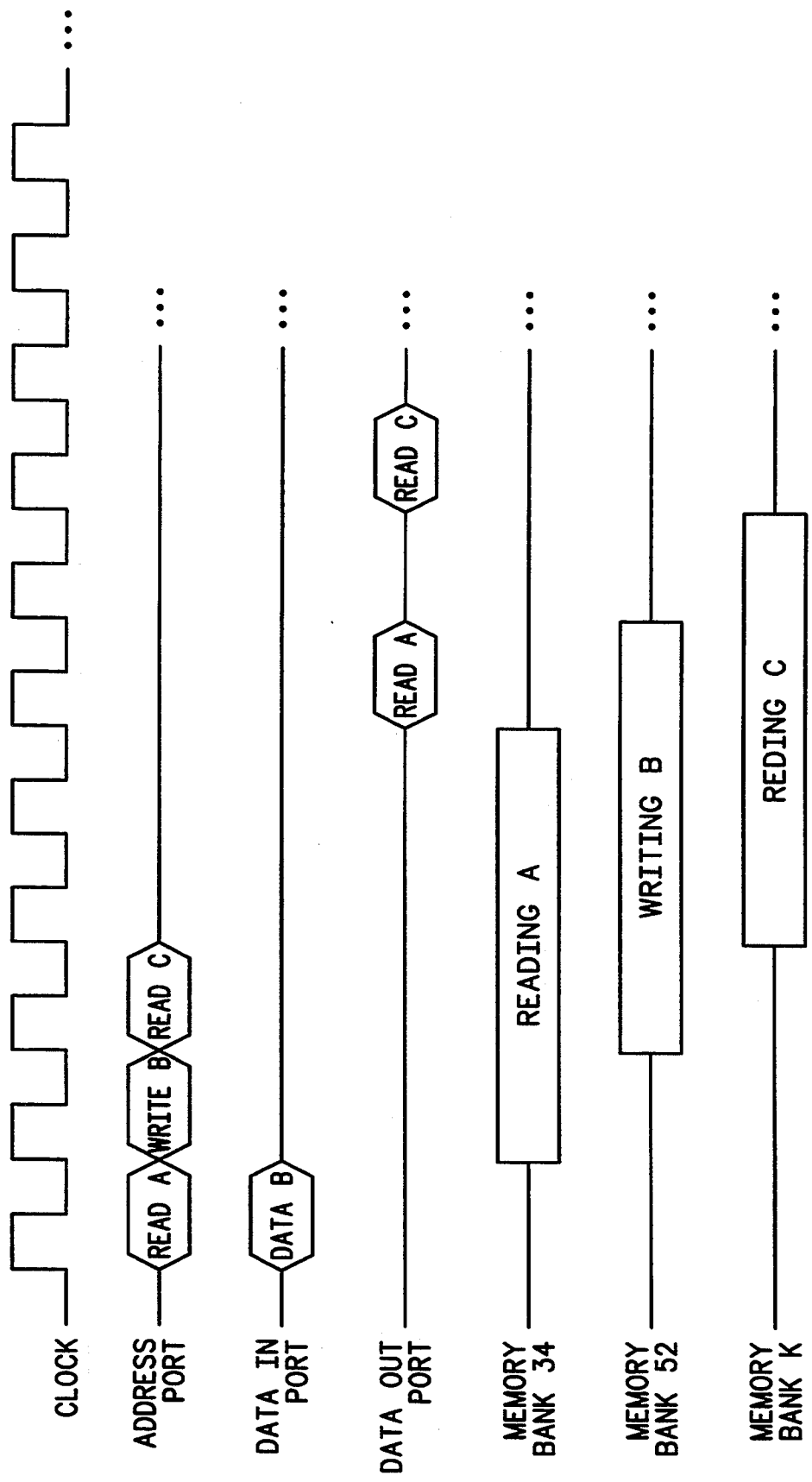
FIG. 4 illustrates in timing diagram form a timing diagram of the system of FIG. 2.

A timing example of the data processing system 22 is illustrated in FIG. 4. Assume that the user of the data processing system 22 executes a first instruction which reads an information value labelled "A" from the Memory Device 28. The information value A is stored in the memory bank 34. A second instruction is executed by the data processing system 22 writes an information value labelled "B" to the Memory Device 28. The information value B is stored in the memory bank 52. The data processing system 22 may then continue to execute a plurality of instructions to perform a respective plurality of memory access functions. For example, the data processing system 22 may request that an information value labelled "C" be read from Memory Device 28. In the known data processing system 10, the system must wait for the information value A to be accessed and retrieved from a first one of the plurality of randomly accessible memory portions before the information value B is accessed from a second one of the plurality of the randomly accessible memory portions. In the implementation of the data processing system 22, however, the system begins execution of the instruction to write the information value B immediately after beginning execution of the instruction to read the information value A as a result of the independent control and subsequent overlapped timing of the array of memory banks.

Assume that the clock signal illustrated in FIG. 4 represents the operating frequency of the Data Processor 24 in the data processing system 22. When the data processing system 22 reads an information value A, an instruction is executed to provide the appropriate information and control signals. The appropriate information and control signals are entered through an Address Port. Therefore, on a first clock cycle, the information and control signals associated with the read operation of information A are provided. On a second clock cycle, the Memory Device 28 begins to manipulate the information and control signals to execute the read operation in memory bank 34. The first step in the manipulation of the information and control signals is to write each pertinent signal value in the plurality of latch circuits 40, 42, and 50, illustrated in FIG. 3. The conductors used to transfer the control and information signals are then free to transfer another set of information and control signals associated with a different memory access operation.

After a predetermined number of clock cycles, the manipulation of the information and control signals necessary to read the information value A is fully executed, and the information value A is available to the Data Out Port.

While the read operation of information value A is being executed, a write operation of information value B to memory bank 52 is executed concurrently. During the first clock cycle, the information and control signals associated with reading information value A are provided by the Address Port and the system 22 also provides the information value B to a Data In Port. On the second clock cycle, when the Memory Device 28 begins to manipulate the information and control signals associated with the read operation of information value A, the data processing system 22 provides the information and control signals associated with the write operation of information value B to the Address Port. On a third clock cycle, the system 22 begins to manipulate the information and control signals necessary to execute the write operation in the memory bank 52. Again, the first step in the manipulation of the information is to store the pertinent signal values in the plurality of latch circuits (not shown) associated with the memory bank 52.

While information value A is being read and information value B is being written, an operation to read information value C from a memory bank (not shown) is executed concurrently. When the data processing system 22 reads an information value C, an instruction is implemented to provide the appropriate information and control signals via the Address Port. Therefore, on the third clock cycle, the information and control signals associated with the read operation of information C are provided to the Address Port. On a fourth clock cycle, the Memory Device 28 begins to manipulate the information and control signals to execute the read operation in the memory bank (not shown). The first step in the manipulation of the information and control signals is to write each pertinent signal value in the plurality of latch circuits 40, 42, and 50, illustrated in FIG. 3. Again, the conductors used to transfer the control and information signals are then free to transfer another set of information and control signals associated with a different memory access operation.

After a predetermined number of clock cycles, the manipulation of the information and control signals necessary to read the information value C is fully executed, and the information value C is available to the Data Out Port.

By utilizing the plurality of latch circuits such as 40, 42, and 50, associated with each one of the plurality of memory banks, several read or write operations of different memory arrays comprising the same memory device may be concurrently processed by the data processing system 22. The plurality of latch circuits effectively stores the information necessary to complete memory access operations in each one of the plurality of memory banks concurrently, thereby allowing each one of the plurality of memory banks to function independently of other memory banks. Therefore, a plurality of conductors connected between the Data Processor 24, the Address Controller 26 and the Memory Device 28 transfer signals associated with a current memory operation before a previous memory operation is fully executed.

The randomly accessible memory with time overlapping memory accesses allows the data processing system 22 to perform more memory access operations in a fixed amount of time. Because the Memory Device 28 may start to process a new memory access operation at the start of each clock cycle, more memory access operations are begun and subsequently completed in a fixed amount of time. As previously discussed, when a data processing system accesses a plurality of peripheral memory devices in an interleaved manner, a first address of a first peripheral memory device is accessed and then a first address of a second peripheral memory device is concurrently accessed. Similarly, a plurality of other memory devices may be accessed while the first and the second devices process a respective first and a second memory access operation. During the memory access operations, the randomly accessible memory processes a plurality of memory access operations of one or all of the peripheral memory devices concurrently.

In the data processing system 22, the Memory Device 28 is especially useful when implementing an interleaved memory access. The plurality of latch circuits, 40, 42, and 50, provide a means to store data and address information values of a first memory access. As the first memory access is being executed, the plurality of Address, Address Control, Data Out Control, Data Out, Data In Control, and Data In signals are free to begin execution of a second memory access. In the data processing system 22, a plurality of memory accesses may be executed concurrently. The address decode operation necessary to execute a plurality of interleaved memory accesses is controlled by the Address Controller 26.

There has been provided herein, a data processing system having a randomly accessible memory with time overlapping memory accesses. The randomly accessible memory is comprised of a plurality of memory arrays each of which has a plurality of latch circuits to store a first information value associated with a memory operation. Therefore, after the first information and control signals associated with a first memory operation are stored in the appropriate plurality of latch circuits, the conductors transfer a second information signal associated with a second memory operation. While one memory access operation is initiated in the Data Processor 24, one or more memory access operations may also be concurrently executed in the Memory Device 28.

It should be well understood that the randomly accessible memory with time overlapping memory accesses described herein provides an effective and unique solution to shorten the latency between the performance of peripheral memory devices and the performance of data processing system. By enabling the memory device associated with the data processing system to execute memory operations concurrently, the efficiency of the data processing system is noticeably improved. The circuitry used to enable the memory device to execute memory access operations concurrently does not occupy a large amount of circuit area, and is, therefore, relatively inexpensive to implement on a semiconductor device.

By now it should be apparent that there has been provided a data processor with a randomly accessible memory having time overlapping memory accesses. The implementation of the invention described herein is provided by way of example only. Many other implementations may exist for executing the function described herein. For example, in the data processing system 22, both the Data Processor 24 and the Address Controller 26 could be implemented using a variety of standard logic circuitry.

Additionally, the configuration of the Memory Device 28 might be modified in many ways. For example, the Address Bank Decode logic circuit 30, the Data In Bank Address Decode logic circuit 32, and the Data Out Bank Address Decode logic circuit 56 could be implemented in any form of standard logic circuitry which provides a decoding function. Any number of memory banks, such as 34 and 52, may comprise the Memory Device 28. The function described herein would continue to operate adequately with a plurality of memory banks, but the cost effectiveness of the number of memory banks must be determined by the user of the system. The described invention might also be modified by the manner in which the plurality of latch circuits is implemented. Again, numerous standard logic implementations might be used. As well, the random logic circuitry, such as AND gate 36, AND gate 37, AND gate 38, and AND gate 48, might be implemented as another form or logic gate. Likewise the decoder 44 functions to decode information values and may be implemented in a manner determined to be most efficient by the user of the data processing system 22. The memory element 46 may be implemented as any memory device. For example, the memory element 46 may be implemented as either a ROM (Read Only Memory), a RAM (Random Access Memory) or a DRAM (Dynamic RAM).

The memory device described herein provides a versatile and efficient circuit and method to implement a randomly accessible memory which execute memory operations concurrently. The memory device may be implemented in a variety of logic circuits as determined by a designer of a data processing system. The memory device will, however, increase the performance and efficiency of any system in which it is implemented.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. An integrated circuit, comprising:
   an address bank decoder for decoding an address bank signal to provide a first one of a plurality of bank enable signals, the address bank decoder having an input for receiving the address bank signal and a plurality of outputs wherein each of the plurality of outputs provides a respective one of the plurality of bank enable signals;
   an input data decoder for decoding an input data bank signal to provide a first one of a plurality of input enable signals, the input data decoder having an input for receiving the input data bank signal and a plurality of outputs wherein each of the plurality of outputs provides a respective one of the input enable signals;
   an output data decoder for decoding an output data bank signal to provide a first one of a plurality of output enable signals, the output data decoder having an input for receiving the output data bank signal and a plurality of outputs wherein each of the plurality of outputs provides a respective one of the output enable signals; and
   a plurality of memory banks wherein each of the plurality of memory banks is concurrently accessible, each of the plurality of memory banks, comprising:
   a first latch for selectively storing a first address value in response to a first enable signal;
   a second latch for selectively storing a first data value in response to a second enable signal;
   a third latch for selectively storing a second data value in response to a third enable signal;
   a fourth latch for selectively storing a first control value in response to a fourth enable signal;
   logic means for selectively asserting the first enable signal, the second enable signal, the third enable signal, and the fourth enable signal when a corresponding one of the plurality of bank enable signals is in a predetermined logic state, the logic means being coupled to each of the first latch, the second latch, the third latch, and the fourth latch; and an array of memory storage elements for selectively communicating a digital information value, the array of memory storage elements being coupled to each of the first latch, the second latch, the third latch, and the fourth latch;

wherein a first one of the plurality of memory banks executes a first data communication operation subsequent to latching the first address value, the first control value, and one of the first and second data values and a second one of the plurality of memory banks executes a second data communication operation subsequent to latching a second address value, a second control value, and a third data value, the second one of the plurality of memory banks executing the second data communication operation concurrently with the first one of the plurality of memory banks executing the first data communication operation.

2. The integrated circuit of claim 1 wherein the first control signal indicates that the first one of the plurality of memory banks should perform one of a read and a write data operation and the second control signal indicates that the second one of the plurality of memory banks perform one of the read and the write data operation.

3. The integrated circuit of claim 1 wherein the first address value stored in the first latch of a first one of the plurality of memory banks corresponds to a first memory storage element in the array of memory storage elements.

4. The integrated circuit of claim 3 wherein when the first control signal is in a first logic state, the first memory storage element is enabled to perform a memory read operation and when the first control signal is in a second logic state, the first memory storage element to perform a memory write operation.

5. The integrated circuit of claim 1 wherein the logic means logically combines the corresponding one of the plurality of bank enable signals and an address strobe signal to provide the first latch signal.

6. The integrated circuit of claim 1 wherein the logic means logically combines a corresponding one of the plurality of data input bank enable signals and a data input strobe signal to provide the second latch signal.

7. The integrated circuit of claim 1 wherein the logic means logically combines a corresponding one of the plurality of data output bank enable signals and a data output strobe signal to provide the third latch signal.

8. The integrated circuit of claim 1 wherein the logic means logically combines the corresponding one of the plurality of bank enable signals and an address strobe signal to provide the fourth latch signal.

9. A method for accessing a memory in an integrated circuit, comprising the steps of:

receiving a first instruction for executing a first memory operation, the first instruction indicating a first memory location;

decoding the first instruction to indicate a first one of a plurality of memory banks to be accessed during execution of the first memory operation;

storing a first address value in a first latch circuit in the first one of the plurality of memory banks, the first address value corresponding to a first memory location in the first one of the plurality of memory banks;

storing a first control value in a second latch circuit in the first one of the plurality of memory banks, the first control value indicating a type of memory operation to be executed, the type of memory operation being one of a read memory operation and a write memory operation;

receiving a second instruction for executing a second memory operation, the second instruction indicating a second memory location to be accessed;

decoding the second instruction to indicate a second one of the plurality of memory banks to be accessed during execution of the second memory operation;

storing a second address value in a first latch circuit in the second one of the plurality of memory banks, the second address value corresponding to a second memory location in the second one of the plurality of memory banks;

storing a second control value in a second latch circuit in the second one of the plurality of memory banks, the second control information value indicating the type of memory operation to be executed; and concurrently executing the first memory operation in the first one of the plurality of memory banks and the second memory operation in the second one of the plurality of memory banks.

10. The method of claim 9 further comprising the steps of:

storing a first data value in a third latch circuit of the first one of the plurality of memory banks;

enabling the third latch circuit to output the first data value to a driver circuit when the first control information indicates that the first memory operation is the write memory operation;

enabling the first latch circuit to output the first address value stored therein;

accessing the first memory location in the first one of the plurality of memory banks in response to the first address value; and writing the first data value in the first memory location.

11. The method of claim 10 further comprising the steps of:

enabling the first latch circuit to output the first address value stored therein;

accessing a stored data value from the first memory location in the first one of the plurality of memory banks in response to the first address value;

storing the stored data value in a fourth latch circuit when the first control information indicates that the first memory operation is the read memory operation;

enabling the fourth latch circuit to providing the stored data value to an output driver circuit; and enabling the output driver circuit to provide the stored data value in response to an external data output control value.

* * * * *